United States Patent [19]
Uchiyama

[11] Patent Number: 5,655,108
[45] Date of Patent: Aug. 5, 1997

[54] PATTERN-EVALUATION AIDING DEVICE AND METHOD FOR THE SAME

[75] Inventor: Toshihiko Uchiyama, Yokohama, Japan

[73] Assignee: Fujitsu Limited, Kawasaki, Japan

[21] Appl. No.: 402,603

[22] Filed: Mar. 13, 1995

[30] Foreign Application Priority Data

May 12, 1994 [JP] Japan ............................ 6-098617

[51] Int. Cl.$^6$ ............................................. G06F 9/455
[52] U.S. Cl. ........................ 395/500; 364/490; 364/488
[58] Field of Search ..................... 395/500; 364/488, 364/489, 490, 491; 350/96.14; 324/73 R, 158 R; 371/22.3; 361/398

[56] References Cited

U.S. PATENT DOCUMENTS

| | | | |
|---|---|---|---|
| 4,364,633 | 12/1982 | Verber et al. | 350/96.14 |
| 4,791,358 | 12/1988 | Sauerwald et al. | 324/73 R |
| 4,879,717 | 11/1989 | Sauerwald et al. | 371/22.3 |
| 5,001,604 | 3/1991 | Lusby | 361/398 |
| 5,093,797 | 3/1992 | Yotsuya et al. | 364/489 |
| 5,162,729 | 11/1992 | Lusby | 324/158 R |
| 5,396,615 | 3/1995 | Tani | 395/500 |

OTHER PUBLICATIONS

"The Dynamic Reduction of Fault Simulation", by F. Maamari and J. Rajski, IEEE, Test Conference, 1990 Proceedings, pp. 801–808.

"Generalized Expressions for Characterizing a Linear Multiport Circuit Coupled with External Fields", by Ishigami et al., IEEE Transactions on Electromagnetic Compatibility, vol. 36, No. 1, Feb. 1994, pp. 40–42.

"Simple extension of TRL calibration method of VANA", by D. Kostevc, IEEE, Electronics Letters, Apr. 1995, pp. 634–635.

*Primary Examiner*—Kevin J. Teska
*Assistant Examiner*—Russell W. Frejd
*Attorney, Agent, or Firm*—Staas & Halsey

[57] ABSTRACT

A pattern-evaluation aiding device evaluating a pattern of lines connecting nodes includes a memory unit storing a current voltage level applied to each of the nodes, a magnitude of a change in the current voltage level, and reflection coefficients for a reflection of the change. The reflection coefficients are provided for different values of the current voltage level and for different values of the magnitude. An operation unit calculates an updated current voltage level for each of the nodes based on the current voltage level, the magnitude of the change, and a corresponding one of the reflection coefficients.

18 Claims, 9 Drawing Sheets

FIG. 8

| $V_A$ $\diagdown$ $V_L$ | 5.0 | 4.0 | 3.0 | 2.0 | 1.0 | ... |
|---|---|---|---|---|---|---|
| 5.0 | 0.997 | 0.985 | 0.981 | 0.975 | 0.958 | ... |
| 4.0 | 0.984 | 0.979 | 0.961 | 0.955 | 0.948 | ... |
| 3.0 | 0.456 | 0.341 | 0.236 | 0.102 | -0.395 | ... |
| 2.0 | -0.268 | -0.491 | -0.603 | -0.650 | -0.661 | ... |
| 1.0 | -0.553 | . | . | . | . | ... |
| -1.0 | -0.599 | . | . | . | . | ... |
| -2.0 | -0.739 | . | . | . | . | ... |
| ⋮ | ⋮ | ⋮ | ⋮ | ⋮ | ⋮ | ... |

NODES OF DEVICES

INPUT NODE

OUTPUT NODE GENERATING HIGH LEVEL

OUTPUT NODE GENERATING LOW LEVEL

PATTERN-EVALUATION AIDING DEVICE AND METHOD FOR THE SAME

BACKGROUND OF THE INVENTION

1. Field of the Invention

The present invention generally relates to pattern-evaluation aiding devices and methods, and more particularly relates to a pattern-evaluation aiding device and a method which can emulate signal patterns appearing on lines connecting nodes of devices implemented on a circuit board.

2. Description of the Prior Art

Many electronic devices contain multi-chip modules or printed boards on which IC chips are implemented and connected with each other. Also, such large devices as transfer devices contain a plurality of modules connected with each other via connecters, whose pins are connected together through lines formed on a mother board.

On a multi-chip module board, a printed board, or a mother board (hereinafter, these are collectively called a circuit board), a wiring pattern is formed to provide lines which connect devices with each other and also with input/output nodes.

Characteristic impedances of such lines need to match impedances of devices connected thereto, otherwise signal reflections may appear at nodes of these devices. However, typical pattern designing processes do not take into account such impedance matching for all nodes connected to a wiring pattern. This is because a scope for designing the wiring pattern is usually restricted by a size and a shape of the circuit board, and also because impedance mismatches between a plurality of devices make it difficult to cope with all the nodes. In the designing of the wiring pattern, also, certain requirements are regarded to be more important than a requirement for the impedance matching, such requirements including the use of pattern-designing processes of a standard type and the use of lines having a uniform thickness on a circuit board. Thus, it is not common to use a pattern-designing technique which forms lines of varying widths and varying cross-sectional areas for achieving the impedance matching.

FIG. 1 shows an illustrative drawing showing an example of signal reflections between two devices. As shown in FIG. 1, a signal sent by a driving device 91 is propagated on a wiring pattern 92 on a circuit board 94 to reach an input node of a driven device 93. Since an input impedance of the driven device 93 does not match a characteristic impedance of the wiring pattern 92, the signal is reflected at the input node of the driven device 93. Further, the reflected signal is again reflected at an output node of the driving device 91. That is, signal reflections are repeated between those two devices via the wiring pattern 92. Hereinafter, the signals reflected back and forth on the wiring pattern are referred to as reflected signals.

FIG. 2 is a graph showing voltage level changes at the output node of the driving device 91 and at the input node of the driven device 93. In FIG. 2, the voltage level at the input node of the driven device 93 has a temporal variation shown by dotted lines. When the driving device 93 is a digital device showing a strong impedance mismatch, the voltage level at the input node can have a variation of a large magnitude. As a result, the voltage level at the input node may go below a threshold voltage level Vth of the device, thus creating a malfunctioning case.

In the prior art, methods for avoiding such a malfunction include making a rough estimate of a number of repetitions, by which number of repetitions reflected signals on a wiring pattern between devices converge into a stable signal. The rough estimate of this number is conventionally made by assuming the same number of repetitions for all the paths on the wiring pattern, thus ignoring individual differences in impedances between different paths and different devices. Then, a delay time necessary for signals to become stable is obtained by multiplying a delay time of the wiring pattern by the number of repetitions estimated above. The delay time thus obtained is optimum in a sense that this is the shortest time period for achieving the stable signal on the wiring pattern. Then, an optimal arrangement of the wiring pattern and the devices is designed by using the optimum delay time obtained above.

In the prior art method described above, however, the estimate of the repetition number is based on an assumption which ignores the impedance differences between the devices and the paths. As a result, a truncation error owing to the use of the finite number of repetitions can become too large to be ignored in some cases. Thus, enough precision cannot be achieved which is required for a complex wiring pattern used in highly sophisticated electronic devices.

Furthermore, circuits operating at high speed demand a small delay time for each device. Thus, such circuits should be evaluated more precisely prior to the manufacturing of the circuits as to whether they can stably operate within established parameters.

Accordingly, there is a need in the field of pattern evaluation for a pattern-evaluation aiding device and a method which can emulate signal patterns on a wiring pattern with an increased precision.

SUMMARY OF THE INVENTION

Accordingly, it is a general object of the present invention to provide a pattern-evaluation aiding device and a method which can satisfy the need described above.

Also, it is another and more specific object of the present invention to provide a pattern-evaluation aiding device and a method which can emulate signal patterns on a wiring pattern with an increased precision.

In order to achieve the above object according to the present invention, a pattern-evaluation aiding device evaluating a wiring pattern connecting nodes of devices includes a memory unit storing a current voltage level applied to each of the nodes, a magnitude of a change in the current voltage level, and reflection coefficients for a reflection of the change, wherein the reflection coefficients are provided for different values of the current voltage level and for different values of the magnitude, and an operation unit calculating an updated current voltage level for each of the nodes based on the current voltage level, the magnitude of the change, and a corresponding one of the reflection coefficients.

Thus, the pattern-evaluation aiding device can provide a criterion for precisely emulating a distribution of standing-waves on the wiring pattern and variations of signal patterns at the nodes of the devices.

The same object can also be achieved by a method of emulating signal changes at nodes of devices connected to a wiring pattern. The method includes storing reflection coefficients for each of the nodes, which reflection coefficients are provided for different values of a current voltage level applied to a corresponding one of the nodes and for different values of a magnitude of a change in the current voltage level, and calculating an updated current voltage level for each of the nodes based on the current voltage level, the magnitude of the change, and a corresponding one of the reflection coefficients.

BRIEF DESCRIPTION OF THE DRAWINGS

FIG. 8 is an illustrative drawing of a reflection coefficient library of the first embodiment;

DESCRIPTION OF THE PREFERRED EMBODIMENTS

First, a description will be given of principles of the present invention with reference to the accompanying drawings.

Figure 1:
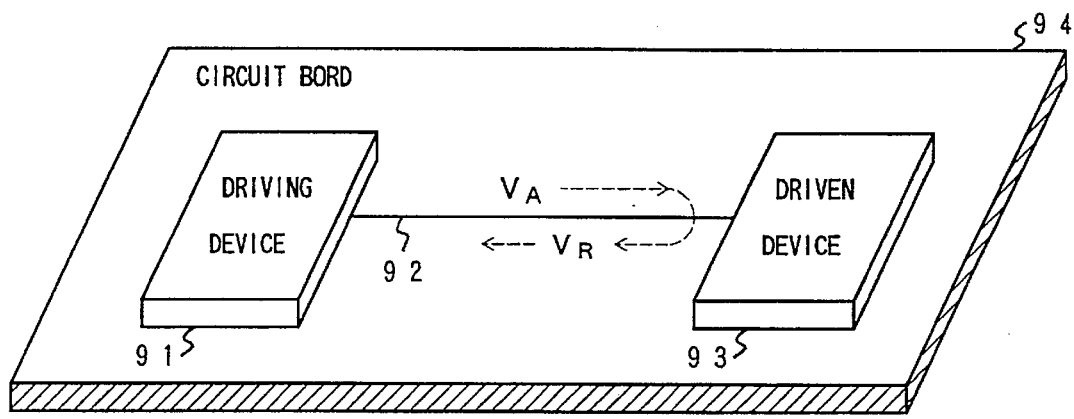
FIG. 1 is an illustrative drawing showing an example of signal reflections between two devices.
Figure 2:
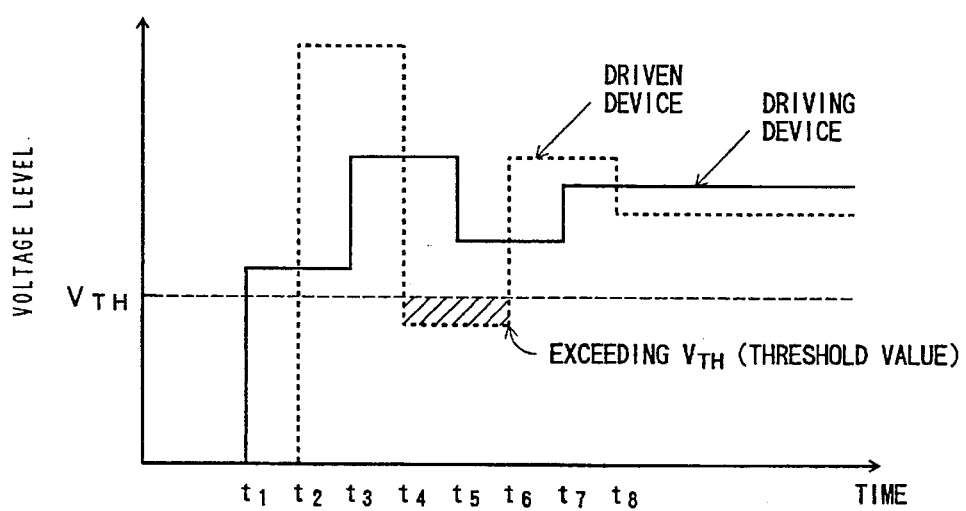
FIG. 2 is a graph showing voltage level changes at an output node of a driving device and at an input node of a driven device of FIG. 1.
Figure 3:
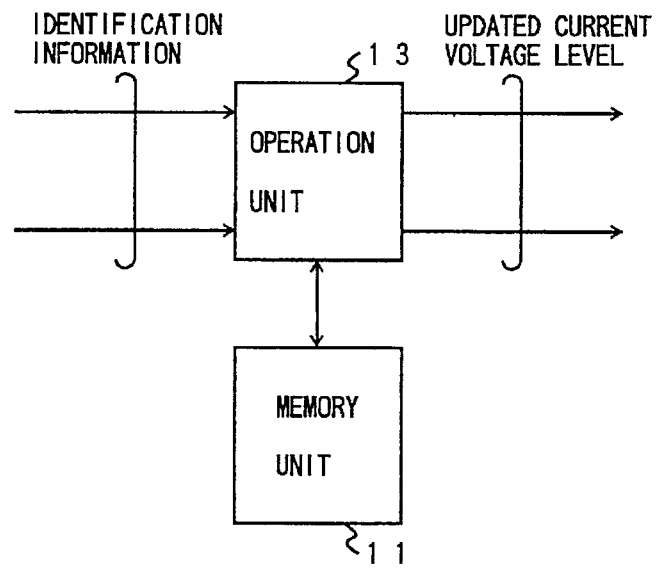
FIG. 3 is a block diagram of a pattern-evaluation aiding device according to a first principle of the present invention.

FIG. 3 shows a block diagram of a pattern-evaluation aiding device according to a first principle of the present invention. In FIG. 3, the pattern-evaluation aiding device includes a memory unit 11 and an operation unit 13.

The memory unit 11 stores reflection coefficients of each node of each device for different current voltage levels and different magnitudes of changes in signal levels. When devices have non-linear characteristics as in semiconductors and the like, impedances of nodes of such devices vary depending on current voltage levels applied to the nodes and the magnitudes of signal changes. Thus, by storing reflection coefficients for different voltage levels and different magnitudes, the memory unit 11 can prepare for any conditions which each node may encounter.

The operation unit 13 receives identification information regarding nodes connected to a line. Also, in accordance with a current voltage level and a given magnitude, the operation unit 13 reads reflection coefficients from the memory unit 11 for the nodes identified by the identification information. Then, the operation unit 13 calculates an updated current voltage level of each node by adding the current voltage level plus the given magnitude to the given magnitude multiplied by a corresponding reflection coefficient. Details of this calculation will be described later.

According to the first principle, the pattern-evaluation aiding device can provide a criterion for precisely estimating a distribution of standing-waves on the line and variations of signal patterns at both ends of the line.

Figure 4:
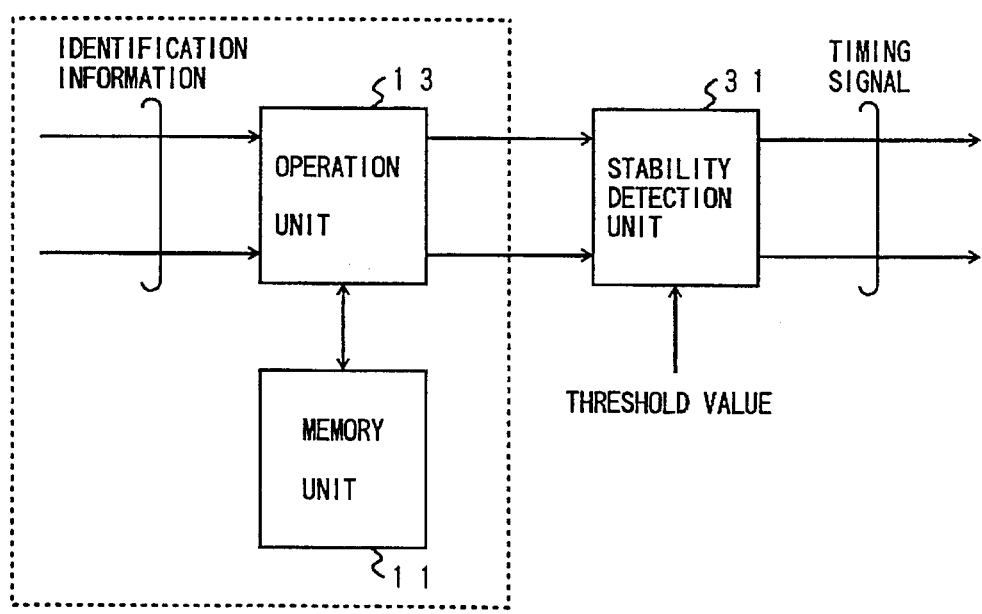
FIG. 4 is a block diagram of a pattern-evaluation aiding device according to a second principle of the present invention.

FIG. 4 shows a block diagram of a pattern-evaluation aiding device according to a second principle of the present invention. The pattern-evaluation aiding device of FIG. 4 differs from that of FIG. 3 only in a stability detection unit 31.

The stability detection unit 31 receives the updated current voltage level of each node from the operation unit 13, and compares it with a predetermined threshold value corresponding to each node. This comparison is made for each updated voltage level forming a time series. The stability detection unit 31 generates a timing signal indicating that results of the comparison become stable, i.e., the updated voltage levels become stable relative to the threshold value.

Thus, according to the second principle, a time period necessary for the signal levels to become stable relative to the threshold value can be precisely obtained.

In the following, embodiments of the present invention will be described with reference to the accompanying drawings.

Figure 5:
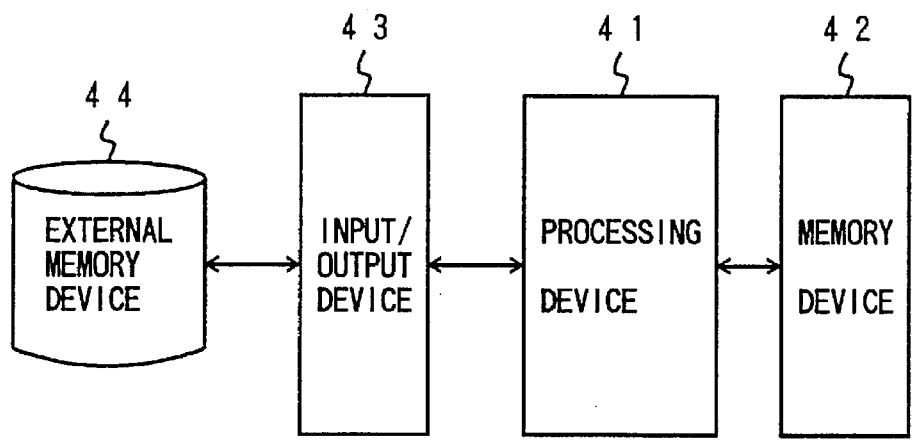
FIG. 5 is a block diagram of a first embodiment of a pattern-evaluation aiding device according to the present invention.

FIG. 5 shows a block diagram of a first embodiment of a pattern-evaluation aiding device according to the present invention. The pattern-evaluation aiding device of the first embodiment includes a processing device 41, a memory device 42, an input/output device 43, and an external memory device 44. As for relations with elements of FIG. 3 and FIG. 4, the processing device 41 of FIG. 5 corresponds to the operation unit 13 and to the stability detection unit 31. Also, the memory device 42, the input/output device 43, and the external memory device 44 correspond to the memory unit 11.

The external memory device 44 stores a connection information library, a delay library, and a reflection coefficient library. The connection information library contains a list of all the paths (lines) connecting nodes of devices with each other, which paths are represented by node names and identifications of the devices. The delay library contains a list of delay times for all the input nodes, where a delay time of an input node indicates an allowable delay time for that input node. The reflection coefficient library contains a list of reflection coefficients μ for all the input nodes and all output nodes with regard to a wiring pattern having a predetermined characteristic impedance.

A reflection coefficient μ of a given node is given as a ratio of a magnitude $V_A$ of a step signal applied to the node to a magnitude $V_R$ of a reflected signal reflected by the node. That is, $$\mu = V_R/V_A.$$

Figure 6:
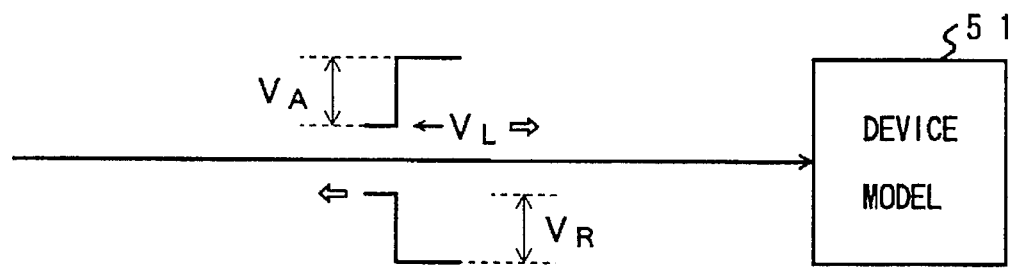
FIG. 6 is an illustrative drawing for explaining a reflection of a signal at a node of a device.

This is shown in FIG. 6, in which a step signal having a magnitude $V_A$ applied to a device model 51 is reflected to generate a reflected signal having a magnitude $V_R$.

When the device model 51 is a non-linear device such as that comprising semiconductors, an impedance of the device varies in accordance with an applied voltage level, and so does the reflection coefficient μ. Specifically, the reflection coefficient μ depends on a current voltage level $V_L$ and a magnitude of a change $V_A$ (i.e., the magnitude of a step signal).

Assume that an output node of a driving device is connected to an input node of a driven device via a single path. Then, let reflection coefficients of the output node and the input node be $\mu_d$ and $\mu_r$, respectively. Also, current voltage levels of the output node of the driving device and the input node of the driven device are denoted by $V_{Ld}$ and $V_{Lr}$, respectively. Magnitudes of step signals applied to the input node and the output node are denoted by $V_{Ad}$ and $V_{Ar}$, respectively. Then, when these step signals are applied to the pertinent nodes, the current voltage levels $V_{Ld}$ and $V_{Lr}$ are respectively changed to $$V_{Ld}' = V_{Ld} + (1+\mu_d) V_{Ad} \quad (1)$$

$$V_{Lr}' = V_{Lr} + (1+\eta_r) V_{Ar} \quad (2).$$

Figure 7:
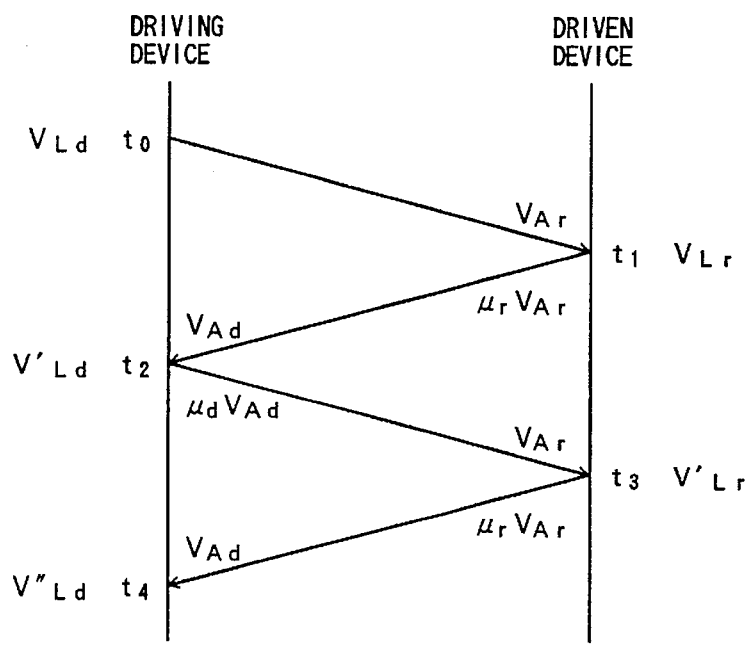
FIG. 7 is a chart of signal reflections at nodes of a driving device and a driven device.

The mechanism of the changes in the current voltage levels $V_{Ld}$ and $V_{Lr}$ is shown in FIG. 7. As shown in FIG. 7, the input node of the driven device initially has the current voltage level $V_{Lr}$. When the step signal having the magnitude $V_{Ar}$ arrives, the voltage level of the input node may become $V_{Lr}$ plus $V_{Ar}$ without the reflection of the signal. However, since the pulse signal is reflected at the input node to generate the reflected signal having the magnitude $\eta_r V_{Ar}'$, the voltage level of the input node actually ends up becoming $V_{Lr}$ plus $V_{Ar}$ plus $\mu_r V_{Ar}$. The same calculation can be also applied for the output node of the driving device.

Each of the equations (1) and (2) shows the relationship between the current voltage level and the updated voltage level, and can be used for calculating a time series of the voltage levels appearing at the nodes before converging into a stable signal. Hereinafter, a loss caused by a resistance on the path is ignored for the simplicity of the calculation.

The reflection coefficient library described above contains reflection coefficients necessary for the calculation of the equations (1) and (2). An example of the reflection coefficient library is shown in FIG. 8.

As shown in FIG. 8, the reflection coefficient library contains a single table for an input node of a given device and two tables for an output node. An input node of a device has reflection coefficients which depend on the current voltage level $V_L$ and the magnitude of a change $V_A$ in the current voltage level. These two different measures of voltage levels are quantized into several voltage levels to constitute the table for the input node shown in FIG. 8. A single output node has two tables which have the same structure as that of the input node table, because the input impedance of the node and, thus, the reflection coefficients of that node are different for different output voltage levels. That is, the input impedance of the output node when the output node generates a high level such as 5 V is different from the input impedance of that node when it outputs a low level such as 0 V.

The reflection coefficients stored in the reflection coefficient library can be obtained by using circuit simulators such as SPICE and the like.

Figure 9:
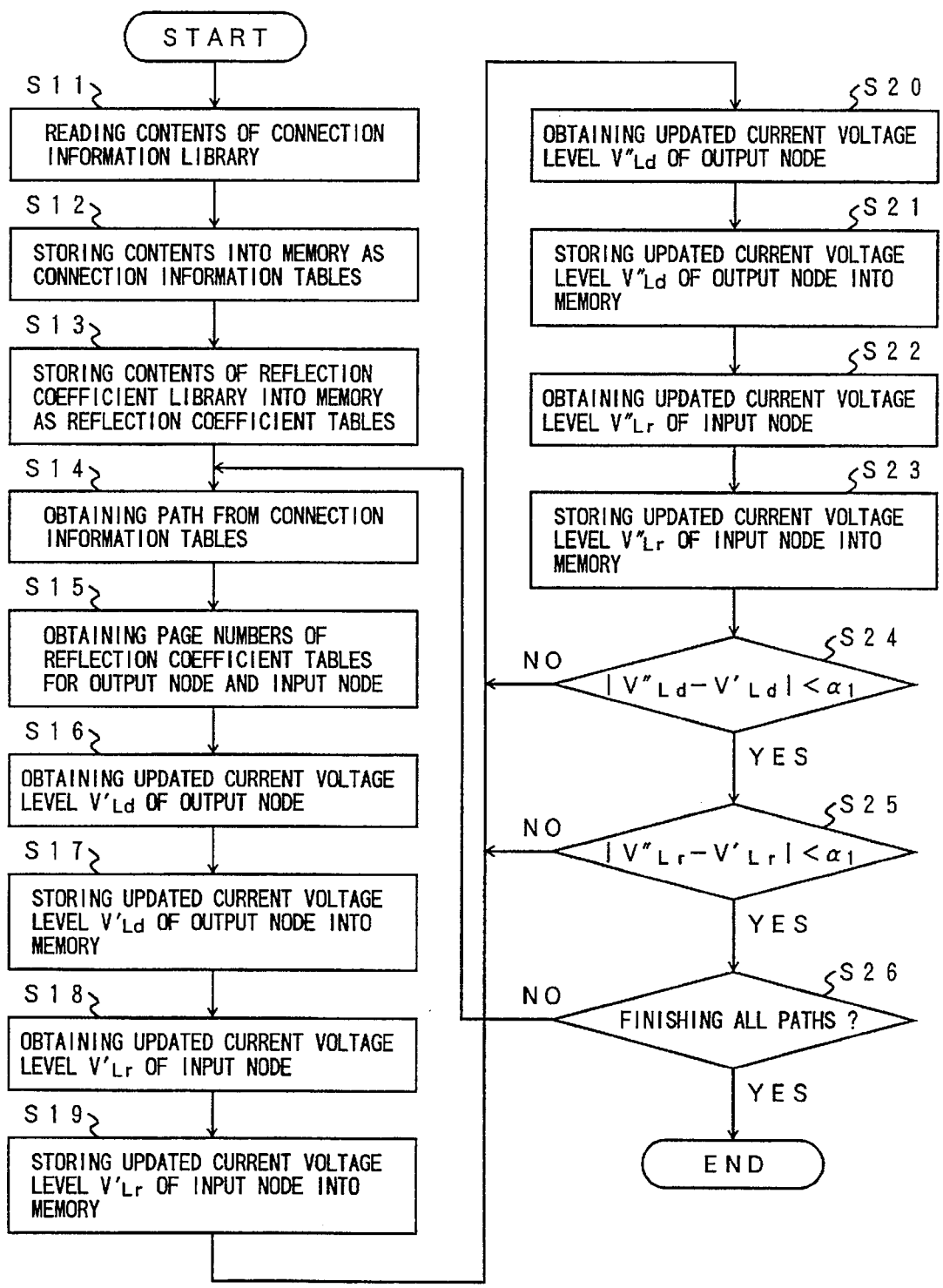
FIG. 9 is a flowchart of a procedure of calculating a time series of voltage levels on each path according to the first embodiment.

FIG. 9 is a flowchart which shows a procedure of calculating a time series of voltage levels on each path according to the first embodiment. This calculation is performed by the processing device 41 of FIG. 5.

At a step S11, the processing device 41 reads contents of the connection information library from the external memory device 44 via the input/output device 43. At a step S12, the processing device 41 stores the contents into the memory device 42 as connection information tables. At a step S13, the processing device 41 reads contents of the reflection coefficient library from the external memory device 44 via the input/output device 43, and stores the contents into the memory device 42 as reflection coefficient tables.

At a step S14, the processing device 41 looks up a connection information table to obtain a single path pertinent to a calculation. At a step S15, the processing device 41 obtains page numbers of reflection coefficient tables for an output node of a driving device and for an input node of a driven device, which devices are connected to the path obtained at the step S14.

At a step S16, the processing device 41 obtains an updated current voltage level $V'_{Ld}$ of the output node of the driving device by using the current voltage level $V_{Ld}$ and the magnitude of an output step signal generated by the output node. Since the output node just outputs a voltage level at this time, a reflection need not be taken into consideration. Also, the magnitude of the output step signal is the same as the magnitude of a step signal applied to the input node of the driven device, and the magnitude of the output step signal should be denoted as $V_{Ar}$. Thus, the updated current voltage level $V'_{Ld}$ of the output node becomes as follows.

$$V'_{Ld} = V_{Ld} + V_{Ar} \quad (3)$$

At a step S17, the processing device 41 stores the updated current voltage level $V'_{dr}$ into the memory device 42.

At a step S18, the processing device 41 obtains an updated current voltage level $V'_{Lr}$ of the input node of the driven device by using the current voltage level $V_{Lr}$ and the magnitude of the step signal $V_{Ar}$. In order to calculate the updated current voltage level $V'_{Lr}$, the processing device 41 obtains from the reflection tables a reflection coefficient $\mu_r$ relevant to the current voltage level $V_{Lr}$ and the magnitude of the step signal $V_{Ar}$. Then, the updated current voltage level $V'_{Lr}$ can be obtained by using the equation (2).

At a step S19, the processing device 41 stores the updated current Voltage level $V'_{Lr}$ into the memory device 42.

At a step S20, the processing device 41 obtains an updated current voltage level $V''_{Ld}$ of the output node of the driving device by using the current voltage level $V'_{Ld}$ and the magnitude of the step signal $V_{Ad}$, which is the magnitude of a reflected signal from the input node of the driven device, i.e., $$V_{Ad} = \mu_r V_{Ar} \quad (4)$$

In order to calculate the updated current voltage level $V''_{Ld}$, the processing device 41 obtains from the reflection tables a reflection coefficient $\mu_d$ relevant to the current voltage level $V'_{Ld}$ and the magnitude of the step signal $V_{Ad}$. Then, the updated current voltage level $V''_{Ld}$ can be obtained by using the equation (1).

At a step S21, the processing device 41 stores the updated current voltage level $V''_{Ld}$ into the memory device 42 in an order of the time series.

At a step S22, the processing device 41 obtains an updated current voltage level $V''_{Lr}$ of the input node of the driven device by using the current voltage level $V'_{Lr}$ and the magnitude of the step signal $V_{Ar}$, which is the magnitude of a reflected signal from the output node of the driving device, i.e., $$V_{Ar} = \mu_d V_{Ad} \quad (5)$$

In order to calculate the updated current voltage level $V''_{Lr}$, the processing device 41 obtains from the reflection tables a reflection coefficient $\mu_r$ relevant to the current voltage level $V'_{Lr}$ and the magnitude of the step signal $V_{Ar}$. Then, the updated current voltage level $V''_{Lr}$ can be obtained by using the equation (2).

At a step S23, the processing device 41 stores the updated current voltage level $V''_{Lr}$ into the memory device 42 in an order of the time series.

At a step S24, the processing device 41 compares a predetermined threshold value $\alpha_1$ with a difference between the updated current voltage level $V''_{Ld}$ and the current voltage level $V'_{Ld}$. If the difference is more than or equal to the predetermined threshold value $\alpha_1$, the procedure goes back to the step S20 and repeats the steps S20 through S24. If the difference is less than the predetermined threshold value $\alpha_1$, the procedure proceeds to a step S25.

At the step S25, the processing device 41 compares a predetermined threshold value $\alpha_2$ with a difference between the updated current voltage level $V''_{Lr}$ and the current Voltage level $V'_{Lr}$. If the difference is more than or equal to the predetermined threshold value $\alpha_2$, the procedure goes back to the step S20 and repeats the steps S20 through S25. If the difference is less than the predetermined threshold value $\alpha_2$, the procedure proceeds to a step S26.

At the step S26, the processing device 41 checks whether the above procedure is applied to all paths registered in the connection information tables. If it is not, the procedure goes back to the step S14. If it is, the procedure is finished.

In this manner, according to the present invention, temporal variations in the voltage levels at the nodes of the driving device and the driven device occurring because of the impedance mismatches between a line and these nodes can be obtained with enough precision by using the reflection coefficients varying in accordance with the changes of the voltage levels.

Thus, in the designing process of a circuit board according to the present invention, reliable checks can be made whether characteristic impedances of the wiring pattern are appropriate. Also, results of the checks can provide an appropriate criteria for designing an optimal arrangement of the devices and an optimal shape of the wiring pattern.

In the operations described above, the processing device 41 precisely emulates changes in the signal voltage levels by using reflection coefficients varying in accordance with the voltage levels applied to the nodes.

A second embodiment of the present invention differs from the first embodiment only in how to obtain the reflection coefficients in emulating the signal changes. In the following, only differences between these two embodiments will be described.

In the first embodiment, the reflection coefficients are prepared for any combination of the current voltage level and the magnitude of a change. That is, since these two voltage measures can take any one of predetermined quantized values, all the reflection coefficients which are possibly used should be prepared. In the second embodiment, however, a linear interpolation is used for obtaining reflection coefficients. This leads to a smaller memory size for storing the reflection coefficients.

Figure 10:
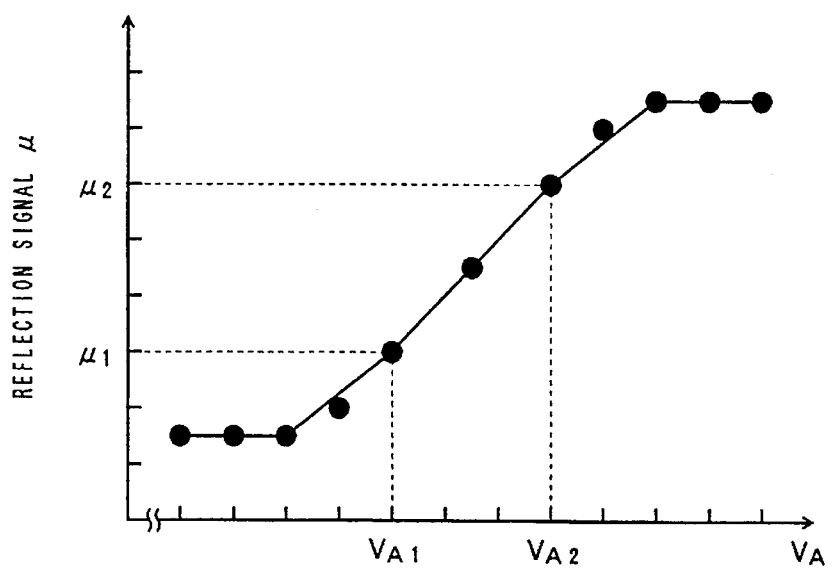
FIG. 10 is a graph showing a relation between a reflection coefficient and a magnitude of a change for a given current voltage level.

FIG. 10 shows a relation between the reflection coefficient $\mu$ and the magnitude of a change $V_A$ when the current voltage level $V_L$ is given. Filled circles indicate this relation for quantized values of the magnitude of a change $V_A$ taken at equal intervals. As shown in FIG. 10, the relation between $\mu$ and $V_A$ can be approximated by lines connected in a series, each of which lines fits into the relation within a corresponding interval. In the example of FIG. 10, the relation is approximated by five lines connected together.

Thus, the reflection coefficient $\mu$ can be obtained by using the magnitudes of changes $V_{A1}$ and $V_{A2}$ at both ends of such a line and respective reflection coefficients $\mu_1$ and $\mu_2$. Namely, the reflection coefficient $\mu$ can be interpolated by a linear equation, $$\mu = a\, V_A + b \tag{6}$$

$$a = (\mu_1 - \mu_2)/(V_{A1} - V_{A2}) \tag{7}$$

$$b = (V_{A1}\, \mu_2 - V_{A2}\, \mu_1)/(V_{A1} - V_{A2}) \tag{8}$$

Here, the possible range of the magnitude of a change $V_A$ may be evenly divided by a predetermined integer (i.e., five as in this example), so that the values $V_{A1}$ and $V_{A2}$ at boundaries can be apparently obtained.

Figure 11:
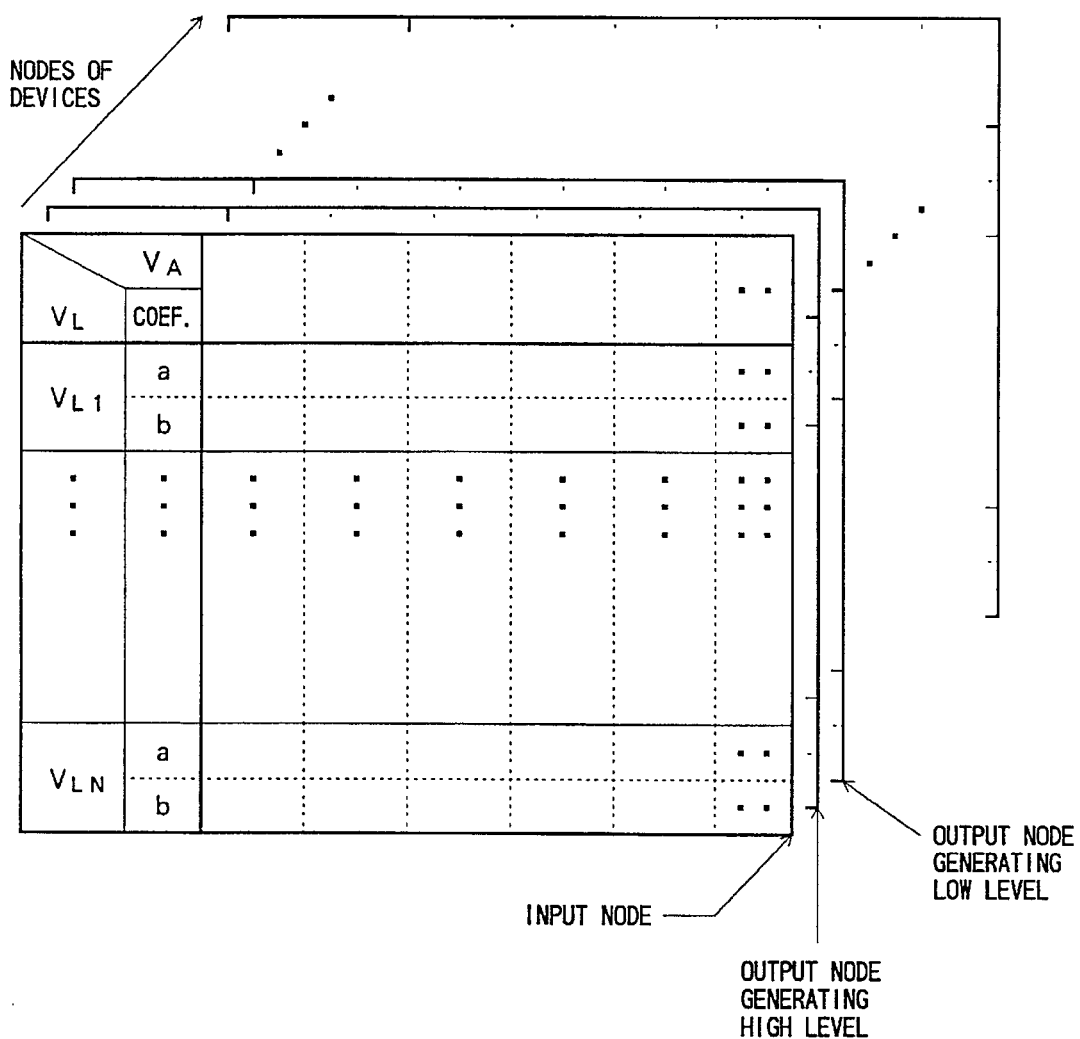
FIG. 11 is an illustrative drawing showing a reflection coefficient library used for linear interpolation according to a second embodiment of the present invention.

FIG. 11 shows a reflection coefficient library constructed by using the coefficients a and b of the equations (7) and (8). The reflection coefficient library shown in FIG. 11 contains a plurality of lists of the coefficients a and b, each of which lists is provided for a corresponding current voltage level $V_{Ln}$ (n=1, ..., N) of a given node of a given device. Each pair of the coefficients a and b contained in one of such lists is used for calculating the reflection coefficient $\mu$ within a corresponding interval of $V_A$.

Actually, the same as the reflection coefficient library of the first embodiment, the reflection coefficient library of the second embodiment contains a single table for an input node and two tables for an output node, as shown in FIG. 11

In the second embodiment, the processing device 41 looks up pages of the reflection coefficient tables, which pages correspond to nodes connected to a relevant path. Then, the processing device 41 calculates the reflection coefficients by using the equation (6) and the coefficients a and b determined by the current voltage level $V_L$ and the magnitude of a change $V_A$. Except for the procedure of obtaining the reflection coefficients as described here, the processing device 41 emulates changes in signals by using the procedure of the first embodiment shown in FIG. 5.

In order to demonstrate a degree of the memory size reduction, a size of the reflection coefficient library of the second embodiment will be compared below with that of the first embodiment. A size S of the reflection coefficient library of the second embodiment is given by $$S = (2\, nmN) \times 3k. \tag{9}$$

Here, n is the number of bytes needed to store each of the coefficients a and b, m is the number of intervals dividing the possible range of $V_A$ in order to perform the linear interpolation, N is the number of quantization steps of the current voltage levels $V_L$, and k is the number of the devices. Each device is assumed to have one input node and one output node. Thus, the number of tables required for a single device is 3, i.e., one for the input node and two for the output node. This is indicated by 3 appearing in the equation (9). Thus, for example, if n is 4 bytes, m is 5 intervals, N is 20 steps, and k is 30 devices, then, the size S becomes 72 Kbytes.

A size s of the reflection coefficient library of the first embodiment is given by $$s = nN^2 \times 3k. \tag{10}$$

Here, n is the number of bytes needed to store each of the reflection coefficients, and N is the number of quantization steps for both the current voltage level $V_L$ and the magnitude of a change $V_A$. If n is 4 bytes, N is 20 steps, and k is 30 devices, then the size s becomes 144 Kbytes.

Thus, the size of the reflection coefficient library can be significantly reduced, as indicated by the ratio of S to s. The degree of the memory reduction will become much more significant, if the number of the quantization steps are made larger in order to obtain precise reflection coefficients.

When the reflection coefficient library of the first embodiment is used, the number of accesses to the library increases in proportion to the number of the calculations of the updated voltage levels. On the other hand, when the reflection coefficient library of the second embodiment is used, the number of the accesses can be smaller than that of the first embodiment. This is because as the signals experience more reflections, a change of the signal levels becomes smaller by nearing to the convergence. Thus, as the number of the reflections increases, the same coefficients a and b belonging to the same interval are more likely to be used. Usually, the number of the calculations for emulating the signal changes can reach several hundred times. With such a large number of calculations, a difference between the two embodiments becomes significant with regard to the number of accesses to the reflection coefficient library. Since the total processing time required for the calculations is shorter with a smaller number of accesses, the second embodiment is advantageous over the first embodiment in this regard.

As described above, according to the second embodiment of the present invention, the memory size required for storing the reflection coefficient library can be significantly reduced, and, thus, the processing time can be made shorter. Yet, the changes in the signals caused by the impedance mismatches between a line and devices connected thereto can be emulated with a satisfactory accuracy.

The equation for interpolation described above is not limited to a linear equation, but can use any function as long as it can provide the reflection coefficients efficiently in a desired precision.

In the example described above, the intervals are provided by evenly dividing the possible range of the magnitude $V_A$. However, the intervals are not limited to this configuration, as long as intervals can be identified by boundary values. For example, the intervals can be made with varying interval lengths. Also, there can be as many intervals as necessary, if the emulation is desired to be more accurate.

Figure 12:
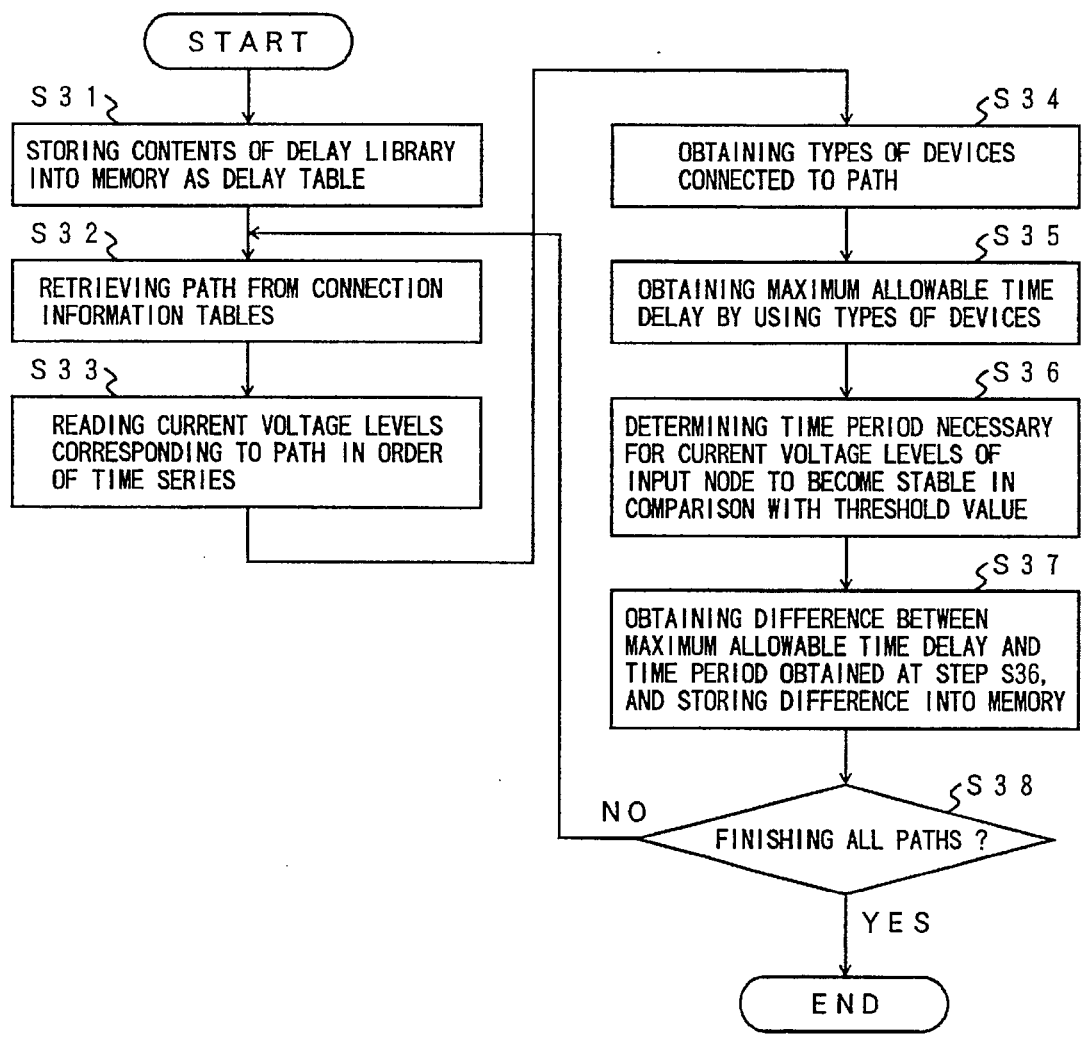
FIG. 12 is a flowchart of an operation of a pattern-evaluation aiding device according to a third embodiment of the present invention.

A third embodiment of the present invention will be described below. FIG. 12 shows a flowchart of an operation of a pattern-evaluation aiding device according to the third embodiment of the present invention.

The pattern-evaluation aiding device of the third embodiment has the same configuration as that of the first embodiment shown in FIG. 5.

As in the first embodiment, time series of the current voltage levels $V_{Ld}$ and $V_{Lr}$ are calculated at the output node of the driving device and the input node of the driven device, respectively. These time series are stored in the memory device 42 each time the current voltage level $V_{Ld}$ or $V_{Lr}$ is obtained.

With reference to FIG. 5 and FIG. 12, at a step S31, the processing device 41 reads contents of the delay library from the external memory device 44 via the input/output device 43, and stores the contents into the memory device 42 as a delay table.

At a step S32, the processing device 41 retrieves a path from the connection information table. At a step S33, the processing device 41 reads the current voltage levels $V_{Ld}$ and $V_{Lr}$ corresponding to the path from the memory device 42 in an order of the time series. At a step S34, the processing device 41 obtains types of the driving device and the driven device connected to the path. At a step S35, the processing device 41 obtains the maximum allowable time delay $D_r$ for the driven device by accessing the delay table by using information on the type of the driven device.

Then, the processing device 41 compares the time series of the voltage levels $V_{Lr}$ with a predetermined threshold value of the driven device. Through this comparison, at a step S36, the processing device 41 determines how long it takes from the time the output signal of the driving device first changes to the time the result of the comparison last changes. In other words, the time length obtained at the step S36 is a necessary time period for the voltage level $V_{Lr}$ to become stable relative to the threshold value. Actually, this time length is obtained by multiplying the delay time of a signal propagating on the path by the number of times the signals are reflected.

At a step S37, the processing device 41 obtains a difference between the time length obtained above and the maximum allowable time delay $D_r$, and stores the difference into the memory device 42.

A sign of the difference stored in the memory device 42 indicates whether the necessary time length for the signal level to become stable is shorter than 1 the maximum allowable time delay $D_r$.

Thus, at a time of pattern designing, an arrangement of driving devices and driven devices can be made optimum, and, also, a shape and size of the wiring 5 pattern connecting these devices can be adjusted to conform with the optimum design. Or the driven devices can be replaced by those which have a longer allowable delay time, or circuits for absorbing the delay time can be added to the prior stage of the driven devices.

In the third embodiment described above, a reference point in time for obtaining the time length is an instance when the output signal of the driving device first changes. However, the reference point can be any point in time which is predetermined to mark the start of the time period for the signal level to become stable.

Figure 13:
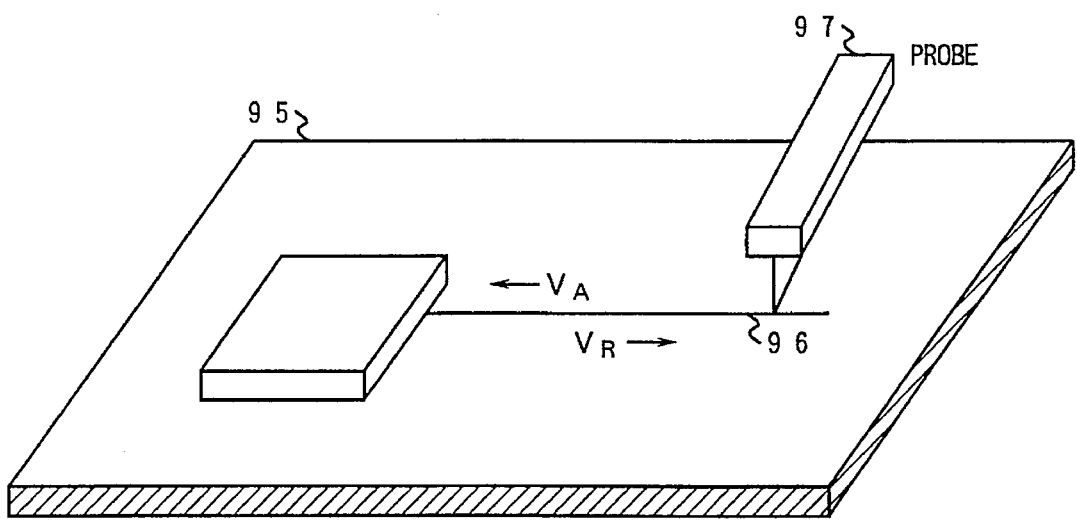
FIG. 13 is an illustrative drawing showing a measurement of reflection signals.

Also, in the first to third embodiments described above, the reflectance coefficients of each device are obtained for different voltage levels by the use of a circuit simulator. However, a method of obtaining the reflectance coefficients is not limited to the use of the circuit simulator, and can be based on measurements of reflectance coefficients in real circuits. For example, as shown in FIG. 13, a device may be implemented on a circuit board 95 and connected to a line 96 formed on the board 95. Then, an input signal having the magnitude $V_A$ can be applied to each node, so that the magnitude $V_R$ of a reflected signal can be measured with a probe 97 having a high input impedance.

Further, in the embodiments described above, the calculations are carried out exclusively for a path having two nodes at both ends. However, the present invention is not limited to such a case, and can be applied to a case in which three or more nodes are connected to a common line.

Also, in the above embodiments, the signal output from the driving device is assumed to be a step signal. However, the present invention is not limited to an analysis using a step signal, and can be applied to an analysis using analog signals also.

Furthermore, in the above embodiments, the same procedure is applied to all the paths registered in the connection information table. However, the present invention is not limited to this algorithm, and the procedure can be applied only to selected paths, which, for example, particularly require stricter noise tolerance.

Also, in the above embodiments, the nodes connected to a line are assumed to belong to different devices. The present invention is not limited to such a case, and can be applied to lines connecting nodes of the same device.

Also, in the above embodiments, one of the nodes connected to a line is an input node, and the other is an output node. The present invention is not limited to such a case, and, for example, can be applied to a case in which a function of nodes is switched between that of input and that of output according to control signals provided from other lines, or a case in which tri-state devices are used.

Furthermore, in the above embodiments, all the processes are carried out by the processing device 41 operating with provided software. The present invention is not limited to the use of software, and can be realized by using hardware for carrying out all or part of the processes.

According to the present invention described above, the signal changes at the nodes connected to a line on a circuit board can be calculated as a time series of the voltage levels by using the reflection coefficients varying in accordance with the voltage levels applied to the nodes. Also, based on the difference between two successive voltage levels, a criterion can be obtained for terminating the calculation of the time series, and, also, a time period for the signals to become stable relative to the threshold value can be obtained.

Thus, it becomes possible to precisely emulate a standing wave and the signal changes at the nodes of both ends of the wiring pattern formed on a circuit board. Also, a truncation error is suppressed while excessive calculations beyond a required precision can be avoided. Furthermore, the time period necessary for the input node of the driven device to become stable can be precisely obtained. Thus, a reliable check can be made whether the wiring pattern connecting the devices on the circuit board are appropriately arranged, which helps the designing process of the wiring pattern.

Further, the present invention is not limited to these embodiments, but various variations and modifications may be made without departing from the scope of the present invention.

What is claimed is:

1. A pattern-evaluation aiding device for evaluating a pattern of lines connecting nodes, said pattern-evaluation aiding device comprising:

a memory unit storing a current voltage level applied to each of said nodes, a magnitude of a change in said current voltage level, and reflection coefficients for a reflection of said change, wherein said reflection coefficients are provided for different values of said current voltage level and for different values of said magnitude; and an operation unit calculating an updated current voltage level for each of said nodes based on said current voltage level, said magnitude of said change, and a corresponding one of said reflection coefficients.

2. The pattern-evaluation aiding device as claimed in claim 1, wherein said memory unit stores, instead of said reflection coefficients, interpolation information for obtaining said reflection coefficients by interpolation, and wherein said operation unit further performs said interpolation to obtain said corresponding one of said reflection coefficients.

3. The pattern-evaluation aiding device as claimed in claim 2, wherein said interpolation is a linear interpolation.

4. The pattern-evaluation aiding device as claimed in claim 1, wherein said operation unit repeatedly calculates said updated current voltage level for each of said nodes by using a previous one of said updated current voltage level as said current voltage level.

5. The pattern-evaluation aiding device as claimed in claim 4, wherein said operation unit further comprises a unit terminating repeated calculations of said updated current voltage level based on a comparison of a predetermined threshold value with a difference between said updated current voltage level and said current voltage level.

6. The pattern-evaluation aiding device as claimed in claim 4, further comprising a stability detection unit making comparisons of a predetermined threshold value with said updated current voltage level calculated in a time series, and indicating a point in time when results of said comparisons become stable.

7. The pattern-evaluation aiding device as claimed in claim 2, wherein said operation unit repeatedly calculates said updated current voltage level for each of said nodes by using a previous one of said updated current voltage level as said current voltage level.

8. The pattern-evaluation aiding device as claimed in claim 7, wherein said operation unit further comprises a unit terminating repeated calculations of said updated current voltage level based on a comparison of a predetermined threshold value with a difference between said updated current voltage level and said current voltage level.

9. The pattern-evaluation aiding device as claimed in claim 7, further comprising a stability detection unit making comparisons of a predetermined threshold value with said updated current voltage level calculated in a time series, and indicating a point in time when results of said comparisons become stable.

10. A method of emulating signal changes at nodes connected to a pattern of lines, said method comprising the steps of:

a) storing reflection coefficients for each of said nodes, which reflection coefficients are provided for different values of a current voltage level applied to a corresponding one of said nodes and for different values of a magnitude of a change in said current voltage level; and b) calculating an updated current voltage level for each of said nodes based on said current voltage level, said magnitude of said change, and a corresponding one of said reflection coefficients.

11. The method as claimed in claim 10, wherein said step a) comprises storing, instead of said reflection coefficients, interpolation information for obtaining said reflection coefficients by interpolation, and wherein said step b) comprises further performing said interpolation to obtain said corresponding one of said reflection coefficients.

12. The method as claimed in claim 11, wherein said interpolation is a linear interpolation.

13. The method as claimed in claim 10, wherein said step b) comprises repeatedly calculating said updated current voltage level for each of said nodes by using a previous one of said updated current voltage level as said current voltage level.

14. The method as claimed in claim 13, further comprising the steps of:

comparing a predetermined threshold value with a difference between said updated current voltage level and said current voltage level; and terminating repeated calculations of said updated current voltage level based on a result of said comparing step.

15. The method as claimed in claim 13, further comprising the steps of:

comparing a predetermined threshold value with said updated current voltage level calculated in a time series; and indicating a point in time when results of said comparisons become stable.

16. The method as claimed in claim 11, wherein said step b) comprises repeatedly calculating said updated current voltage level for each of said nodes by using a previous one of said updated current voltage level as said current voltage level.

17. The method as claimed in claim 16, further comprising the steps of:

comparing a predetermined threshold value with a difference between said updated current voltage level and said current voltage level; and terminating repeated calculations of said updated current voltage level based on a result of said comparing step.

18. The method as claimed in claim 16, further comprising the steps of:

comparing a predetermined threshold value with said updated current voltage level calculated in a time series; and indicating a point in time when results of said comparing step become stable.

* * * * *

UNITED STATES PATENT AND TRADEMARK OFFICE
CERTIFICATE OF CORRECTION

PATENT NO. : 5,655,108
DATED : Aug. 5, 1997
INVENTOR(S) : UCHIYAMA

It is certified that error appears in the above-identified patent and that said Letters Patent is hereby corrected as shown below:

Col. 5, equation (2), change "$(1+\eta_r)$" to --$(1+\mu_r)$--;
line 21, change "$\eta_r\ V_{Ar'}$" to --$\mu_r\ V_{Ar'}$--.

Col. 6, line 22, change "$V'_{dr}$" to --$V'_{Ld}$--;
line 33, change "Voltage" to --voltage--;
line 59, after "$V''_{Lr}$" insert --,--.

Col. 7, line 12, change "Voltage" to --voltage--.

Col. 10, line 12, after "than" delete "1";
line 16, after "wiring" delete "5".

Signed and Sealed this

Twenty-third Day of December, 1997

Attest:

BRUCE LEHMAN

Attesting Officer

Commissioner of Patents and Trademarks